United States Patent [19]

Blauschild et al.

[11] Patent Number: 4,677,315

[45] Date of Patent: Jun. 30, 1987

[54] SWITCHING CIRCUIT WITH HYSTERESIS

[75] Inventors: Robert A. Blauschild, Los Altos; Edmond Toy, Sunnyvale, both of Calif.

[73] Assignee: Signetics Corporation, Sunnyvale, Calif.

[21] Appl. No.: 890,251

[22] Filed: Jul. 28, 1986

[51] Int. Cl.⁴ .................. H03K 5/153; H03K 5/24
[52] U.S. Cl. ................... 307/350; 307/290; 307/359; 307/362
[58] Field of Search .......... 307/290, 350, 359, 360, 307/362

[56]  References Cited

U.S. PATENT DOCUMENTS 3,668,538  6/1972  Hearn .
3,725,673  4/1973  Frederiksen et al. .
4,069,431  1/1978  Kucharewski ................ 307/359
4,406,955  9/1983  Lo Cascio ..................... 307/359
4,587,444  5/1986  Emori et al. .................. 307/359

Primary Examiner—John Zazworsky
Attorney, Agent, or Firm—R. J. Meetin; R. T. Mayer; J. Oisher

[57] ABSTRACT

A circuit switches with a hysteresis defined by separately controllable thresholds which can be made largely independent of temperature and fabrication conditions. The circuit contains a pair of differential portions (21 and 22) and an arithmetic component (24). The hysteresis is introduced into the circuit by using positive feedback to control the position of a switch (23) in such a manner as to change the transconductance of the circuit as it is switching.

14 Claims, 8 Drawing Figures

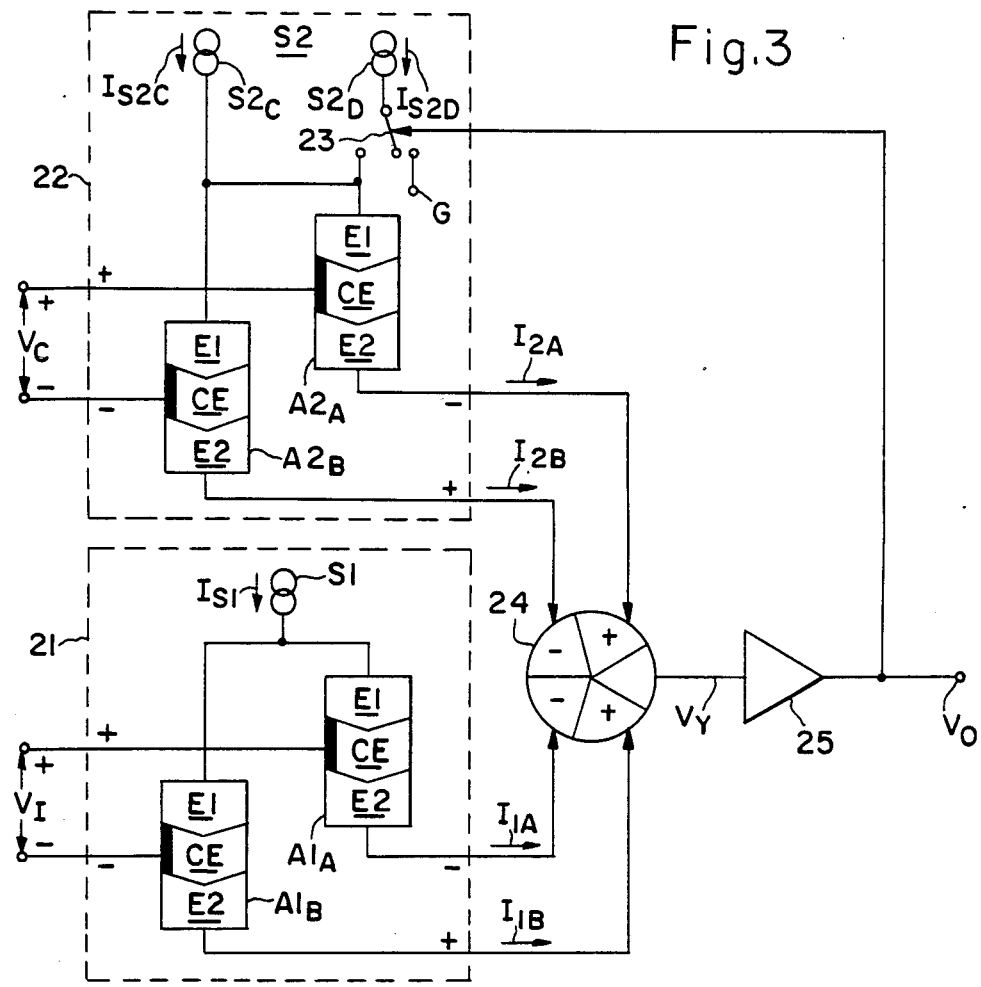
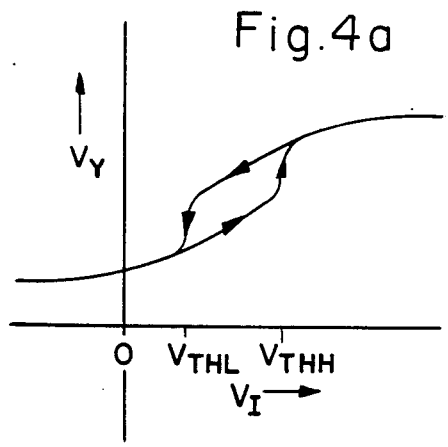 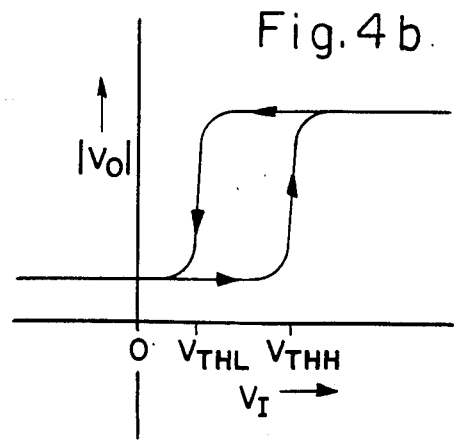

SWITCHING CIRCUIT WITH HYSTERESIS

FIELD OF USE

This invention relates to semiconductor switching circuits that exhibit hysteresis in which (1) a circuit transition from one state to another occurs as an input voltage rises above one threshold and (2) a circuit transition back to the first state occurs as the input voltage drops below another threshold less than the first.

BACKGROUND ART

Switching circuits typically employ hysteresis to provide noise immunity or a safety margin. U.S. Pat. No. 3,725,673 discloses such a hysteresis circuit. FIG. 1 illustrates the basic features of this bipolar circuit. It switches between a pair of states with a hysteresis created by suitably switching a current $I_H$.

The circuit of FIG. 1 employs differential portions 11 and 12. Portion 11 amplifies an input voltage $V_I$, which is here the amount by which a signal voltage $V_{IN}$ exceeds a reference voltage $V_{REF}$, to produce circuit currents $I_{1A}$ and $I_{1B}$ whose difference is representative of $V_I$. The internal configuration (not shown) of portion 11 centers around a pair of Darlington circuits. Each Darlington contains an input PNP transistor whose emitter drives the base of a trailing PNP transistor. The bases of the input transistors differentially receive voltage $V_I$. Currrents $I_{1A}$ and $I_{1B}$ are respectively supplied from the collectors of the trailing transistors whose emitters are connected to a current source to receive a supply current. Portion 12, which is configured the same as portion 11, amplifies a control voltage $V_C$ to produce circuit currents $I_{2A}$ and $I_{2B}$ whose difference is representative of $V_C$.

Currents $I_{1A}$ and $I_{1B}$ are supplied to the inputs of a differential-to-single-ended converter 13. Another such converter 14 generates current $I_H$ by subtracting $I_{2A}$ from $I_{2B}$. A switch 15 provides current $I_H$ to ground or to one of the inputs of converter 13. A voltage $V_X$ is supplied from converter 13 at a value that varies largely in proportion to $I_{1B} - I_{1A} - mI_H$ where m is 1, 0, or $-1$ depending on the switching of current $I_H$. An amplifier 16 amplifies voltage $V_X$ to generate an output voltage $V_O$ which controls the position of switch 15.

Circuit transitions occur when $I_{1B} - I_{1A}$ equals $mI_H$. During a transition, $V_I$ passes through a hysteresis threshold approximately equal to $mK_GV_C$, where $K_G$ is the ratio of the transconductance of portion 12 to that of portion 11. Only two of the three values of m are normally used in any particular embodiment of the circuit. This gives three different cases: (1) m=0, 1; (2) m=−1, 0; and (3) m=−1, 1. FIGS. 2a, 2b, and 2c respectively show the hysteresis characteristics for the three cases. The vertical axes, for example, represent $V_O$. The low and high values of m for each case respectively fix its low and high hysteresis thresholds. Their difference is the magnitude of the hysteresis.

In particular, assume that switch 15 is positioned at the high m value to set the circuit at the high threshold. Starting with $V_I$ low, the circuit changes state as $V_I$ rises above the high threshold. The new $V_O$ value causes switch 15 to switch to the lower m value. This sets the circuit at the low threshold. When $V_I$ later drops, nothing happens until it passes the low threshold. At that point, the circuit goes back to its original state. Switch 15 thereby returns to the high m value to reset the circuit at the high threshold.

The circuit of U.S. Pat. No. 3,725,673 has several desirable features. The amount of hysteresis can be controlled by simply adjusting $K_G$ or $V_C$. Since $K_G$ is a ratio, it is largely independent of temperature and fabrication conditions. $V_C$ can be made largely temperature and process independent. Consequently, the hysteresis thresholds are stable with temperature and processing parameters. The flexibility is, however, somewhat limited because the thresholds are not independently controllable. One of them is either fixed at zero (FIGS. 2a and 2b) or is the negative of the other (FIG. 2c). It would be desirable to overcome this flexibility limitation without sacrificing the preceding advantages.

GENERAL DISCLOSURE OF THE INVENTION

In accordance with the invention, a circuit switches between a pair of states with a hysteresis defined by separately controllable thresholds which can be made largely independent of temperature and fabrication parameters. The hysteresis is introduced into the circuit by using positive feedback to change the transconductance of a part of the circuit as it switches.

The present circuit contains first and second differential portions. The first portion amplifies an input voltage to produce a pair of circuit currents whose difference is representative of the input voltage. The second portion amplifies a control voltage to produce another pair of circuit currents whose difference is representative of the control voltage.

The four currents are operated on to cause the circuit to make state transitions as a function of the input voltage with a hysteresis whose magnitude depends on the control voltage. That is done with an arithmetic component and feedback circuitry. The arithmetic component produces a component signal at a value that varies largely in proportion to a linear combination of (1) the difference between the circuit currents of the first portion and (2) the difference between the circuit currents of the second portion. Generation of the component signal in this way establishes a switching region. The circuit makes transitions between its states largely in synchronism with transitions of the component signal. The feedback circuitry then creates the hysteresis by adjusting the transconductance of the second differential portion in response to the circuit transitions.

More particularly, the hysteresis consists of (1) a transition of a first type in which the circuit switches from one of its states to the other as the input voltage rises above a high threshold and (2) a transition of a second type opposite to the first as the input voltage drops below a low threshold less than the high threshold. The feedback circuitry decreases the transconductance of the second portion in response to a transition of the first type and vice versa. The primary element in the feedback circuitry is a switch that selectively decouples a part of a current source in the second portion from a pair of like-configured three-electrode amplifiers that are arranged in a differential configuration to receive the control voltage in the second portion. The switch opens as the circuit makes a transition of the first type and vice versa.

BRIEF DESCRIPTION OF THE DRAWINGS

FIG. 3 is a block/circuit diagram of a circuit that switches with a hysteresis according to the invention.

FIGS. 4a and 4b are graphs for the hysteresis characteristics of the circuit of FIG. 3.

Like reference symbols are employed in the drawings and in the description of the preferred embodiments to represent the same or very similar item or items.

DESCRIPTION OF THE PREFERRED EMBODIMENTS

Figure 1:
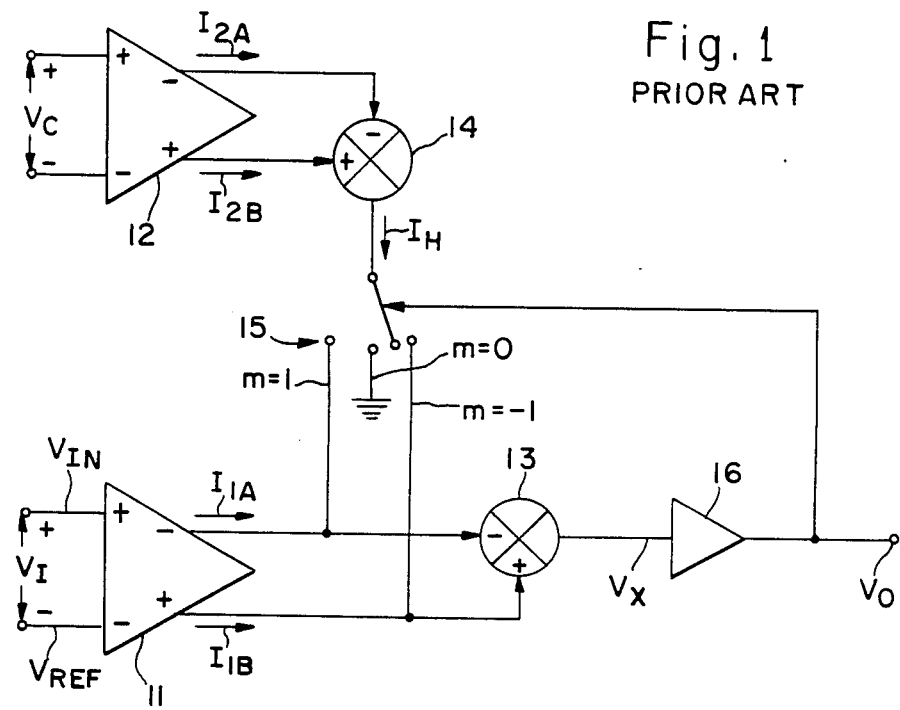
FIG. 1 is a block diagram of a prior art hysteresis switching circuit.
Figure 2A:
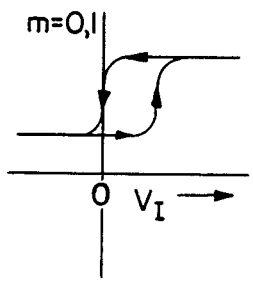
FIGS. 2a–2c are graphs for the hysteresis characteristics of the circuit of FIG. 1.
Figure 2B:
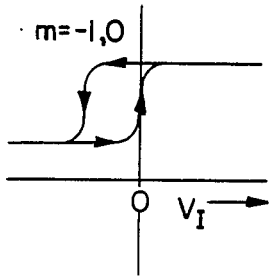
Figure 2C:
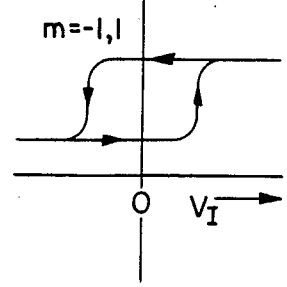

Referring to FIG. 3, it illustrates a circuit that makes transitions between a pair of states with a hysteresis created by changing the transconductance of a part of the circuit during each transition. The condition of the circuit is represented by output voltage $V_O$ which switches between a pair of voltage levels as a fuction of input voltage $V_I$. The circuit makes a transition from one of its states to the other as $V_O$ switches from one of its levels to the other, and vice versa.

This circuit uses various three-electrode amplifiers. Each has a first flow electrode (E1), a second flow electrode (E2), and a control electrode (CE) for controlling current flow between the flow electrodes (E1 and E2). Charge carriers (electrons or holes) moving between the flow electrodes generally originate at the first electrode and terminate at the second electrode.

Each three-electrode amplifier may be embodied with a single transistor. In the case of a field-effect transistor (FET) of either the insulated-gate or junction type, its source, drain, and gate are respectively the first, second, and control electrodes. These are the emitter, collector, and base for a bipolar transistor. A three-electrode amplifier could, however, consist of more than a single transistor. One example is a bipolar Darlington circuit in which the emitter of an input transistor is connected to the base of a trailing transistor (to give a total current gain approximately equal to the product of the individual transistor current gains). In this instance, the control electrode is the base of the input transistor, while the first and second electrodes are the emitter and collector of the trailing transistor.

As used in describing a pair of three-electrode amplifiers, "like-configured" means that they have corresponding elements interconnected in the same way and that each set of corresponding elements is of the same semiconductor polarity. For example, a pair of three-electrode amplifiers would generally be "like-configured" if both are N-channel FET's but not if they are complementary FET's. Likewise, a pair of Darlingtons are "like-configured" as long as the input transistors are the same polarity and the trailing transistors are the same polarity (even if different from that of the input transistors).

In specifying that the difference between a pair of currents is "representative" of a voltage, "representative" means that the magnitude of the difference between the currents has a one-to-one relationship with the magnitude of the voltage as long as the voltage magnitude is not too large. When the voltage magnitude becomes very large, "representative" means that the difference between the currents is largely one value if the voltage is high and another value if the voltage is low.

Returning to FIG. 3, voltage $V_I$ is supplied to the non-inverting (+) and inverting (−) inputs of a differential portion 21 which differentially amplifies input $V_I$ to produce circuit currents $I_{1A}$ and $I_{1B}$ whose difference is representative of $V_I$. Portion 21 contains like-configured three-electrode amplifiers $A1_A$ and $A1_B$ whose control electrodes differentially receive voltage $V_I$. A current source S1 provides a fixed supply current $I_{S1}$ to the interconnected first electrodes of amplifiers $A1_A$ and $A1_B$. Their second electrodes respectively supply currents $I_{1A}$ and $I_{1B}$ to the respective inverting (−) and non-inverting (+) outputs of portion 21.

Control voltage $V_C$ is supplied to the non-inverting and inverting inputs of a differential portion 22 which differentially amplifies voltage $V_C$ to produce circuit currents $I_{2A}$ and $I_{2B}$ whose difference is representative of $V_C$. Portion 22 contains like-configured three-electrode amplifiers $A2_A$ and $A2_B$ whose control electrodes differentially receive voltage $V_C$. A current source S2 provides supply current to the interconnected first electrodes of amplifiers $A2_A$ and $A2_B$. Their second electrodes respectively supply currents $I_{2A}$ and $I_{2B}$ to the inverting and non-inverting outputs of portion 22.

Current source S2 consists of main and switchable portions $S2_C$ and $S2_D$ that provide respective supply currents $I_{S2C}$ and $I_{S2D}$. Main portion $S2_C$ is permanently connected to the first electrodes of amplifiers $A2_A$ and $A2_B$. A two-position switch 23 responsive to output $V_O$ is located between switchable portion $S2_D$ and the first electrodes of amplifiers $A2_A$ and $A2_B$.

A $V_O$ transition in one particular direction causes switch 23 to "close". This establishes a conductive path from portion $S2_D$ to the first electrodes of amplifiers $A2_A$ and $A2_B$. They now receive current $I_{S2D}$. A $V_O$ transition in the opposite direction causes switch 23 to "open". The conductive path between portion $S2_D$ and amplifiers $A2_A$ and $A2_B$ is thereby broken. Current $I_{S2D}$ is diverted to a reference point G such as ground. Alternatively, current source $S2_D$ simply shuts off if point G is an open-circuit position.

In response to currents $I_{1A}$, $I_{1B}$, $I_{2A}$, and $I_{2B}$, an arithmetic component 24 generates a component signal $V_Y$ at a voltage that varies largely in proportion to $I_{1B} - I_{1A} - (I_{2B} - I_{2A})$. An amplifier 25 of a conventional type amplifiers voltage $V_Y$ to generate voltage $V_O$ which is fed back to control switch 23. The polarities of $V_Y$ and $V_O$ may be the same or opposite depending on the internal characteristics of switch 23.

Hysteresis occurs in the circuit as a result of changing of transconductance of portion 22 during each circuit transition. In particular, the transconductance of a differential amplifier such as portion 21 or 22 is the incremental change of its differential output current divided by the incremental change of its differential input voltage. The transconductance is normally largely constant for a significant range centered around zero input voltage and drops gradually to zero as the input voltage moves out of this range. The magnitude of the transconductance at any particular value of the input voltage depends on the amount of amplifier supply current available.

The transconductances $G_{M1}$ and $G_{M2}$ of respective portions 21 and 22 therefore are $d(I_{1B} - I_{1A})/dV_I$ and $d(I_{2B} - I_{2A})/dV_C$. For portion 22, $G_{M2}$ equals $G_{M2C} + nG_{M2D}$ where $G_{M2C}$ is the transconductance due to main portion $S2_C$ of current source S2, $G_{M2D}$ is the further transconductance due to using switchable portion $S2_D$ with main portion $S2_C$, and n is 0 or 1 depending respectively on whether switch 23 is open or closed. During a $V_O$ transition, the difference $I_{2B}-I_{2A}$ equals the difference $I_{1B}-I_{1A}$. Suitably applying the preceding relationships leads to the following approximate relationship for the threshold values $V_{TH}$ of $V_I$ at the transition points:

$$V_{TH} \approx V_C G_{M2}/G_{M1} = V_C(G_{M2C} + nG_{M2D})/G_{M1} \quad (1)$$

FIGS. 4a and 4b show the hysteresis characteristics for the case in which $V_C$ is greater than zero. The top and bottom of the $V_O$ waveform are limited by the upper and lower voltage limits of amplifier 25. The gain of amplifier 25 thereby converts the relatively gradual $V_Y$ transitions into sharp $V_O$ transitions.

If $V_I$ is initially low, n is one (switch 23 is closed) so that $G_{M2}$ equals $G_{M2C} + G_{M2D}$. $V_I$ must rise to a high threshold level $V_{THH}$ approximately equal to $V_C(G_{M2C} + G_{M2D})/G_{M1}$ to enable $V_O$ to make a transition. AT that point, n goes to zero (switch 23 opens). $G_{M2}$ drops to $G_{M2C}$. $V_I$ must now drop to a low threshold voltage $V_{THL}$ approximately equal to $V_C G_{M2C}/G_{M1}$ before $V_O$ can make a reverse transition. When this occurs, n goes back to one (switch 23 closes). $G_{M2}$ returns to $G_{M2C} + G_{M2D}$.

Hysteresis thresholds $V_{THL}$ and $V_{THH}$ are both positive if $V_C$ is positive, and vice versa. For a given value of $V_C$, the distance between $V_{THL}$ and $V_{THH}$ can be varied by adjusting $G_{M2D}$. As a result, the hysteresis thresholds are separately controllable.

The components of portion 21 preferably utilize the same type of transistors as the components of portion 22. The circuit is fabricated as a monolithic integrated circuit (according to conventional planar processing techniques). $G_{M2}$ therefore has approximately the same dependence on temperature and processing parameters as $G_{M1}$ so that the ratio $G_{M2}/G_{M1}$ is largely independent of temperature and fabrication conditions. Voltage $V_C$ is preferably generated in such a manner as to be stable with respect to temperature and processing parameters. The result is that temperature and fabrication processes have little effect on $V_{THL}$ and $V_{THH}$.

The same basic hysteresis characteristics arise if component 24 utilizes the opposite of the difference $I_{2B} - I_{2A}$—i.e., $V_Y$ varies in proportion to $I_{1B} - I_{1A} + (I_{2B} - I_{2A})$. The only change is a reversal of sign in $V_{THL}$ and $V_{THH}$. If desired, this can be compensated for by changing the sign of $V_C$. Like comments apply to utilizing the opposite of the difference $I_{1B} - I_{1A}$.

Before generating $V_Y$, component 24 can (1) multiply the difference between $I_{1A}$ and $I_{1B}$ by a non-dimensional facor $F_1$ and (2) multiply the difference between $I_{2A}$ and $I_{2B}$ by another non-dimensional factor $F_2$. In this case, $V_Y$ varies largely in proportion to the linear combination $F_1(I_{1B}-I_{1A}) - F_2(I_{2B}-I_{2A})$. Eq. (1) is modified to:

$$V_{TH} \approx (F_2/F_1) V_C G_{M2}/G_{M1} \quad (2)$$

For the reasons given above, each factor $F_1$ or $F_2$ may be positive or negative. Suitable design choice enables $F_1$ and $F_2$ to have largely the same dependence on temperature and process. The resulting hysteresis is again stable with temperature and process.

Furthermore, hysteresis occurs if $V_Y$ varies in proportion to a general linear combination of $I_{1A}$, $I_{1B}$, $I_{2A}$, and $I_{2B}$ rather than a linear combination of the differences $I_{1B}-I_{1A}$ and $I_{2B}-I_{2A}$. However, such a general combination normally does not result in temperature and process stability.

Figure 5:
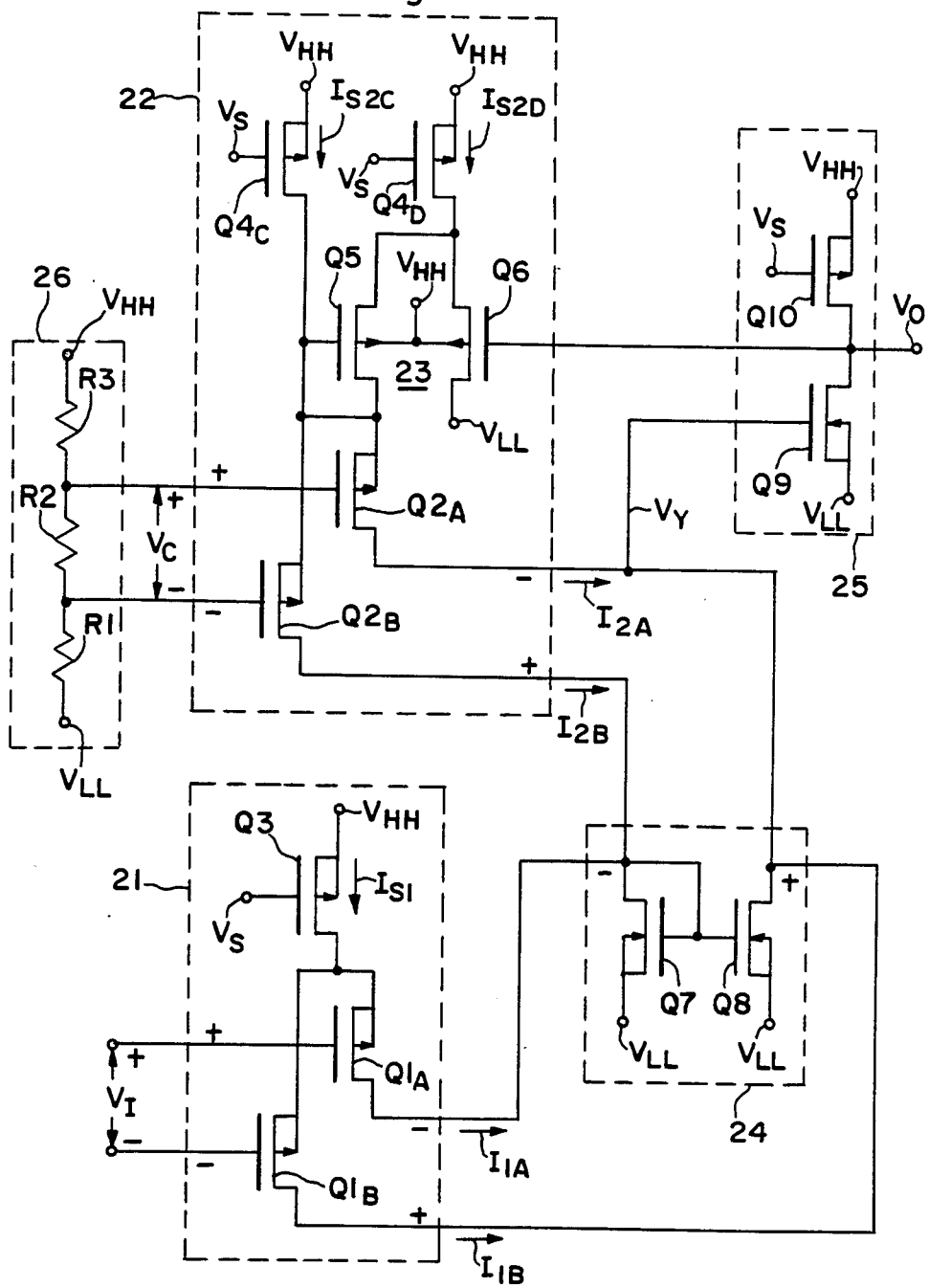
FIG. 5 is a circuit diagram of a preferred embodiment of the circuit of FIG. 3.

FIG. 5 depicts a complementary-FET embodiment of the circuit of FIG. 3. All the FET's shown in FIG. 5 are enhancement-mode insulated-gate FET's. P-channel FET's are indicated by arrows pointing away from their channels. The reverse applies to N-channel FET's.

Amplifiers $A_{1A}$, $A_{1B}$, $A_{2A}$, and $A_{2B}$ of FIG. 3 consist respectively of identical input FET's $Q1_A$, $Q1_B$, $Q2_A$, and $Q2_B$ in portions 21 and 22 of FIG. 5. Each current source S1, $S2_C$, or $S2_D$ is a corresponding FET Q3, $Q4_C$, or $Q4_D$ whose gate receives a reference voltage $V_S$. The sources of FET's Q3, $Q4_C$, and $Q4_D$ are tied to a source of a high supply voltage $V_{HH}$.

Switch 23 consists of a pair of identical FET's Q5 and Q6 arranged in a differential configuration. FET Q5 is connected as a diode between the $Q4_D$ drain and the sources of FET's $Q2_A$ and $Q2_B$. FET Q6 is connected between the $Q4_D$ drain and a source of a low supply voltage $V_{LL}$ corresponding to point G of FIG. 3.

Arithmetic component 24 consists of identical FET's Q7 and Q8 arranged as a conventional current mirror with their gates connected together and to the Q7 drain. $I_{1A}$ and $I_{2B}$ are summed at the Q7 drain at the subtracting input of component 24. $I_{2A}$ and $I_{1B}$ are summed at the Q8 drain at the adding input of component 24 where $V_Y$ is produced. Component 24 operates on the summed currents flowing through Q7 and Q8 in such a way as to force $V_Y$ to vary largely in proportion to $I_{2A} + I_{1B} - (I_{2B} + I_{1A})$. Generation of voltage $V_Y$ at the requisite value occurs as a result of the internal resistances of FET's Q8 and $Q2_A$.

Amplifier 25 consists of complementary FET's Q9 and Q10 arranged as an inverter. $V_Y$ is provided to the gate of FET Q9 whose drain supplies $V_O$ to the Q6 gate at a value inverse to the $V_Y$ value. FET Q10 acts as a load for FET Q9.

As $V_Y$ makes a low-to-high transition, $V_O$ goes low. This causes FET Q6 to turn on hard and pulls the voltage at the interconnected sources of FET's Q5 and Q6 down so as to turn off FET Q5. Switch 23 opens. $I_{S2D}$ is diverted to the $V_{LL}$ supply to reduce $G_{M2}$. The reverse occurs when $V_Y$ later goes low. The resulting high $V_O$ value turns FET Q6 off, allowing FET Q5 to turn on and raise $G_{M2}$.

Voltage $V_C$ in FIG. 5 is provided across the middle resistor of a voltage divider 26 consisting of resistors R1, R2, and R3 connected in series between the $V_{LL}$ and $V_{HH}$ supplies. $V_C$ thereby equals $(V_{HH}-V_{LL})$ times a resistance ratio. The variation of resistors R1-R3 with temperature and processing parameters is largely cancelled out in the resistance ratio. As a result, $V_C$ is largely independent of temperature and process as long as the power supply voltage $V_{HH}-V_{LL}$ is substantially constant.

Ignoring the dependence on input voltage, the transconductance for a differential amplifier such as portion 21 or 22 in FIG. 5 is approximately equal to a constant times the square root of the product of the supply current and the width-to-length ratio (W/L) of the input FET's. Letting $(W/L)_1$ be the W/L for FET's $Q1_A$ and $Q1_B$ and letting $(W/L)_2$ be the W/L for FET's $Q2_A$ and $Q2_B$, application of Eq. (1) gives:

$$V_{THL} \approx V_C \sqrt{(I_{S2C}/I_{S1})(W/L)_2/(W/L)_1} \quad (3)$$

-continued
$$V_{THH} \approx V_C \sqrt{((I_{S2C} + I_{S2D})/I_{S1})(W/L)_2/(W/L)_1} \quad (4)$$

$I_{S1}$, $I_{S2C}$, $I_{S2D}$, $(W/L)_1$, and $(W/L)_2$ vary with process and temperature. These dependencies are cancelled out in the current and width-to-length ratios of Eqs. (3) and (4) to make $V_{THL}$ and $V_{THH}$ largely independent of temperature and process.

$V_{HH}$ and $V_{LL}$ preferably are 5 and 0 volts, respectively, in the embodiment of FIG. 5. $V_S$ is 0.5–1.0 volt below $V_{HH}$. Resistor R2 is 1 kiloohm, while resistors R1 and R3 are each 5 kiloohms. $(W/L)_1$ and $(W/L)_2$ are 40. The Q3 W/L is 20. FET's $Q4_C$ and $Q4_D$ each have a W/L of 7.5. The W/L for FET's Q5 and Q6 is 125.

While the invention has been described with respect to a preferred embodiment, this description is solely for the purpose of illustration and is not to be construed as limiting the scope of the invention claimed below. For example, the control voltage could be variable if it were desirable to dynamically control the hysteresis. If depletion-mode FET's were used to embody the differential portion that receives the control voltage, it could be supplied from a voltage divider consisting of only two resistors. Slew-rate improvement techniques such as those described in U.S. Pat. No. 3,668,538 might be used to regulate the supply current in each differential portion independent of the hysteresis. Thus, various modifications, applications, and changes may be made by those skilled in the art without departing from the true scope and spirit of the invention as defined by the appended claims.

We claim:

1. A circuit comprising: first differential means for amplifying a differential input voltage to produce a pair of circuit currents whose difference is representative of the input voltage; second differential means for amplifying a differential control voltage to produce a pair of circuit currents whose difference is representative of the control voltage; and means responsive to the circuit currents for causing the circuit to make transitions between a pair of states as a function of the input voltage with a hysteresis whose magnitude depends on the control voltage; characterized in that the means for causing comprises:
   an arithmetic component for producing a component signal at a value that varies largely in proportion to a linear combination of (1) the difference between the circuit currents of the first means and (2) the difference between the circuit currents of the second means; and
   feedback means for creating the hysteresis by adjusting the transconductance of the second means in response to transitions of the circuit largely synchronous with transitions of the component signal.

2. A circuit as in claim 1 wherein the hysteresis comprises (1) a transition of a first type in which the circuit switches from one of its states to the other as the input voltage rises above a high threshold and (2) a transition of a second type opposite to the first type as the input voltage drops below a low threshold less than the high threshold, characterized in that the feedback means (1) decreases the transconductance of the second means as the circuit makes a transition of the first type and (2) increases the transconductance of the second means as the circuit makes a transition of the second type.

3. A circuit as in claim 2 wherein: each differential means comprises a current source and a pair of like-configured amplifiers; each amplifier has a first flow electrode, a second flow electrode, and a control electrode for controlling current flow between the flow electrodes; the input voltage is differentially supplied to the control electrodes of the amplifiers of the first means; the control voltage is differentially supplied to the control electrodes of the amplifiers of the second means; the current source of each differential means is coupled to the first electrodes of its amplifiers to provide a supply current for them; and the second electrodes of the amplifiers of each differential means respectively provide its circuit currents; characterized in that the feedback means comprises a switch for selectively decoupling a part of the current source of the second means from the first electrodes of its amplifiers.

4. A circuit as in claim 3 characterized in that the current source of the second means comprises a main portion and a switchable portion, the switch located between the switchable portion and the first electrodes of the amplifiers of the second means.

5. A circuit as in claim 4 characterized in that the switch (1) opens as the circuit makes a transition of the first type and (2) closes as the circuit makes a transition of the second type.

6. A circuit as in claim 4 characterized in that the position of the switch is controlled by an output signal representative of the state of the circuit.

7. A circuit as in claim 6 characterized in that the means for causing includes an amplifier for amplifying the component signal to produce the output signal.

8. A circuit as in claim 5 wherein charge carries that move between the flow electrodes of each amplifier originate at its first electrode and terminate at its second electrode, characterized in that the amplifiers in each differential means are substantially identical field-effect transistors.

9. A circuit as in claim 5 characterized in that each amplifier is a field-effect transistor having a source, a drain, and a gate which are respectively the first, second, and control electrodes of that amplifier.

10. A circuit as in claim 5 characterized by a voltage divider for providing the control voltage.

11. A circuit as in claim 10 characterized in that the divider comprises at least three resistive elements coupled in series, the control voltage being provided across the middle element.

12. A circuit as in claim 2 characterized in that the linear combination is the difference between (1) the product of a first non-dimensional factor and the difference between the circuit currents of the first means and (2) the product of a second non-dimensional factor and the difference between the circuit currents of the second means.

13. A circuit as in claim 12 characterized in that each non-dimensional factor is substantially one.

14. A circuit comprising: first differential means for amplifying a differential input voltage to produce a pair of circuit currents whose difference is representative of the input voltage; second differential means for amplifying a differential control voltage to produce a pair of circuit currents whose difference is representative of the control voltage; and means responsive to the circuit currents for causing the circuit to make transitions between a pair of states as a function of the input voltage with a hysteresis dependent on the control voltage; characterized in that the means for causing comprises:
   an arithmetic component for producing a component signal at a value that varies largely in proportion to a linear combination of the circuit currents; and
   feedback means for creating the hysteresis by adjusting the transconductance of the second means in response to transitions of the circuit largely synchronous with transitions of the component signal.

* * * * *